United States Patent
Kim et al.

(10) Patent No.: US 9,746,955 B2
(45) Date of Patent: Aug. 29, 2017

(54) METHOD OF MANUFACTURING ZINC OXIDE NANOSHEET STRUCTURE, AND ELECTRONIC APPARATUS AND TOUCH SENSOR APPARATUS HAVING THE ZINC OXIDE NANOSHEET STRUCTURE

(71) Applicant: RESEARCH & BUSINESS FOUNDATION SUNGKYUNKWAN UNIVERSITY, Suwon-si (KR)

(72) Inventors: Sang-Woo Kim, Yongin-si (KR); Keun-Young Lee, Suwon-si (KR); Ju-Hyuck Lee, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 102 days.

(21) Appl. No.: 14/919,169

(22) Filed: Oct. 21, 2015

(65) Prior Publication Data
US 2016/0162104 A1    Jun. 9, 2016

(30) Foreign Application Priority Data

Oct. 23, 2014 (KR) .................. 10-2014-0144033
Feb. 27, 2015 (KR) .................. 10-2015-0028121

(51) Int. Cl.
| | | |
|---|---|---|
| H01L 41/187 | (2006.01) | |
| H01L 41/113 | (2006.01) | |
| H01L 41/047 | (2006.01) | |
| G06F 3/041 | (2006.01) | |
| G06F 3/047 | (2006.01) | |
| H01L 41/31 | (2013.01) | |

(52) U.S. Cl.
CPC ............ *G06F 3/0416* (2013.01); *G06F 3/047* (2013.01); *H01L 41/113* (2013.01); *H01L 41/187* (2013.01); *H01L 41/31* (2013.01); *G06F 2203/04103* (2013.01); *Y10S 977/755* (2013.01); *Y10S 977/811* (2013.01)

(58) Field of Classification Search
CPC ..... H01L 41/113; H01L 41/187; H01L 41/31; G06F 3/0416; G06F 3/047
USPC ...... 310/358; 252/62.9 R, 62.9 PZ; 501/134; 345/174
See application file for complete search history.

(56) References Cited

U.S. PATENT DOCUMENTS

| | | | | |
|---|---|---|---|---|
| 5,393,444 A | * | 2/1995 | Asai | .......................... C30B 7/00 252/62.3 ZT |
| 5,981,868 A | * | 11/1999 | Kushiya | .............. H01L 31/0322 136/255 |
| 2008/0197750 A1 | * | 8/2008 | Katardjiev | .......... C23C 14/0617 310/311 |
| 2015/0047555 A1 | * | 2/2015 | Wang | ........................ C30B 7/14 117/68 |

FOREIGN PATENT DOCUMENTS

| | | |
|---|---|---|
| KR | 10-0851281 B1 | 8/2008 |
| KR | 10-2013-0073323 A | 7/2013 |

* cited by examiner

*Primary Examiner* — Thomas Dougherty
(74) *Attorney, Agent, or Firm* — NSIP Law

(57) ABSTRACT

Disclosed herein is a method of manufacturing a zinc oxide nanosheet structure. The zinc oxide nanosheet structure may be manufactured by forming a zinc oxide seed on a substrate and growing zinc oxide from the zinc oxide seed in a zinc oxide growth solution in which zinc precursors and a doping-element-containing compound are dissolved.

11 Claims, 8 Drawing Sheets

[FIG. 1]
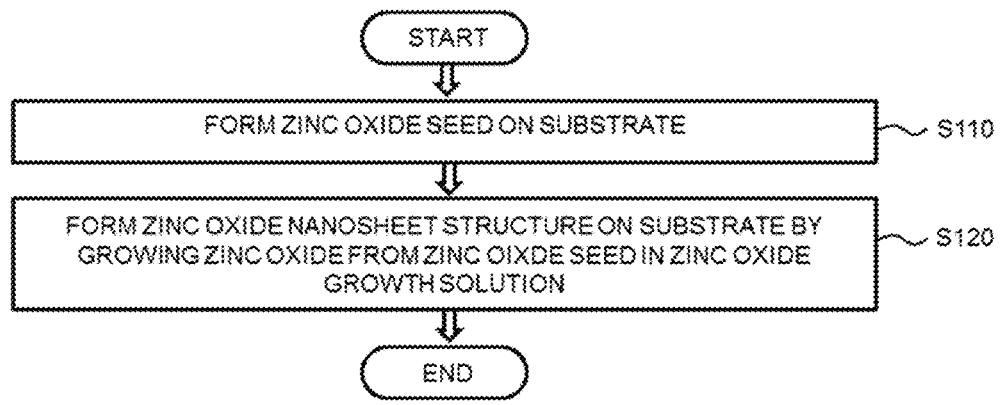

[FIG. 2A]
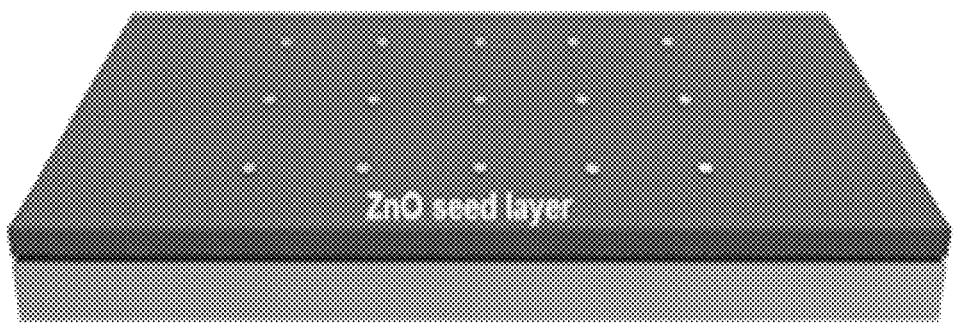
[FIG. 2B]
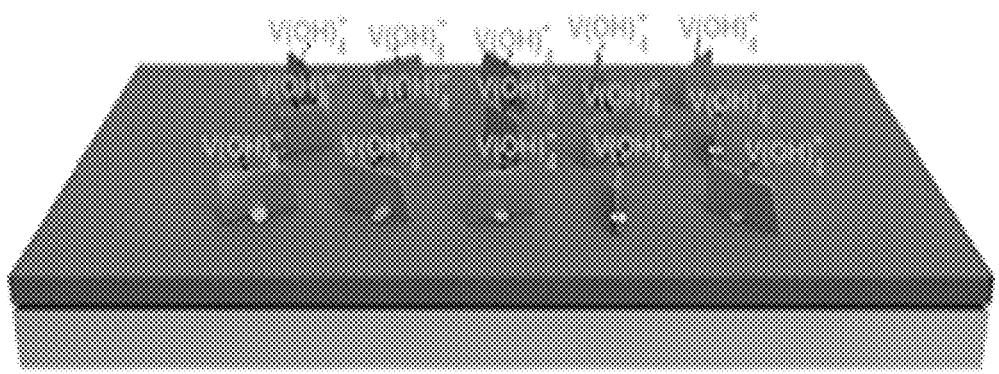

[FIG. 2C]
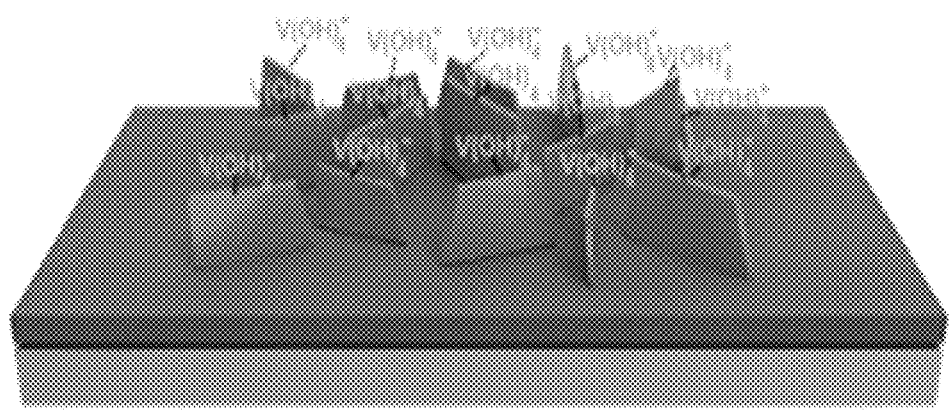
[FIG. 2D]
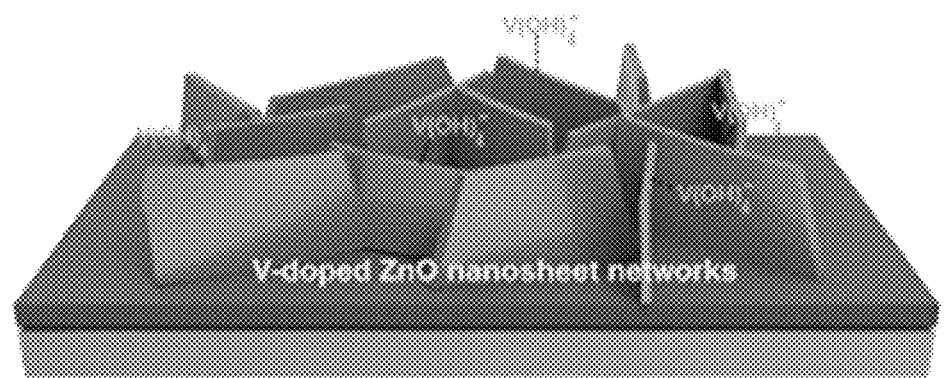

[FIG. 3]
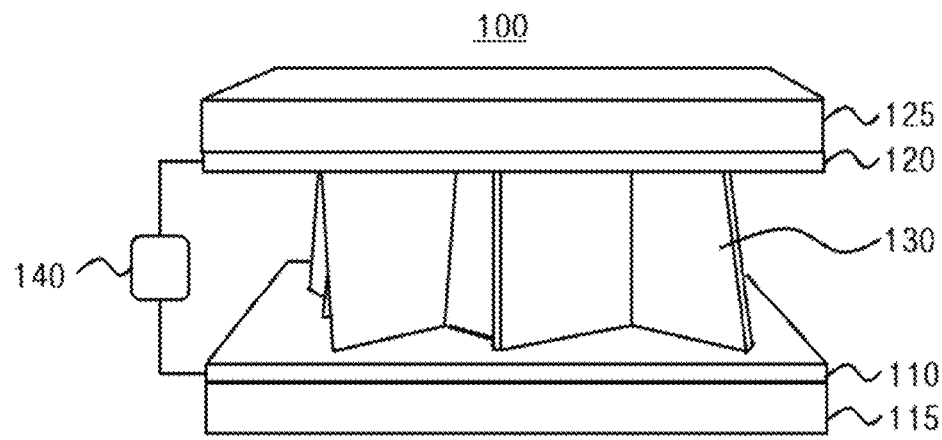
[FIG. 4]
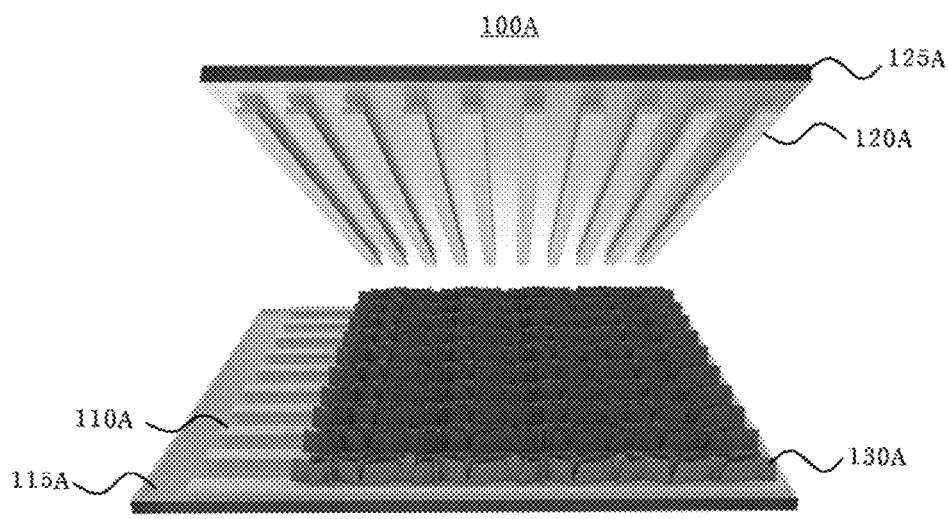

[FIG. 5]
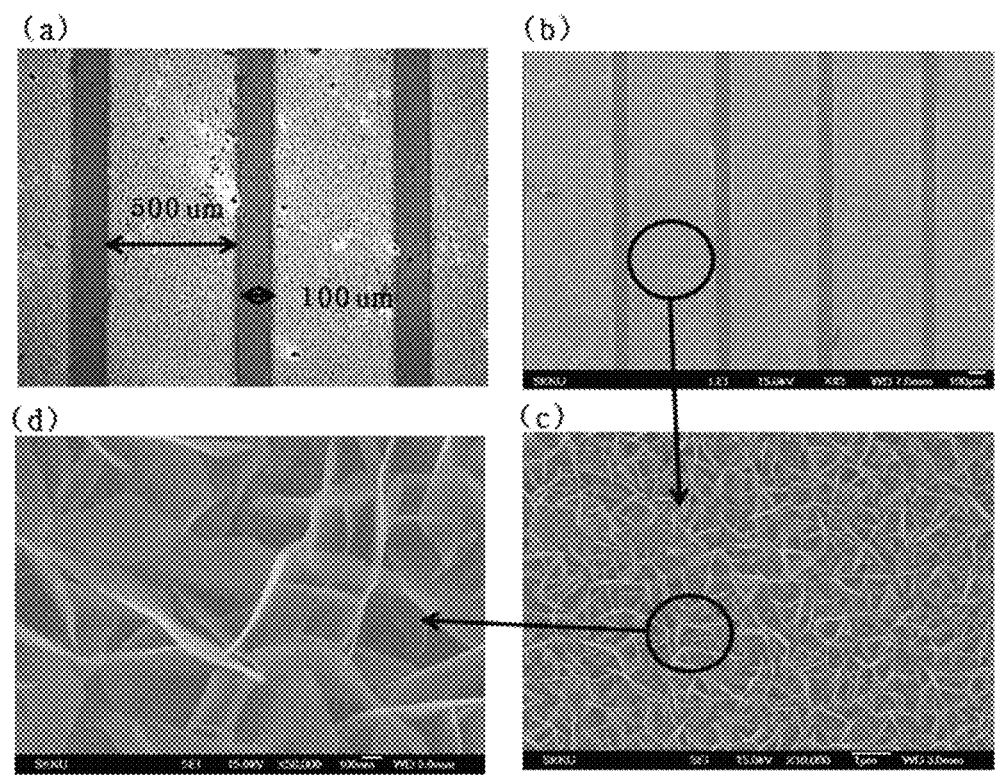

[FIG. 6]
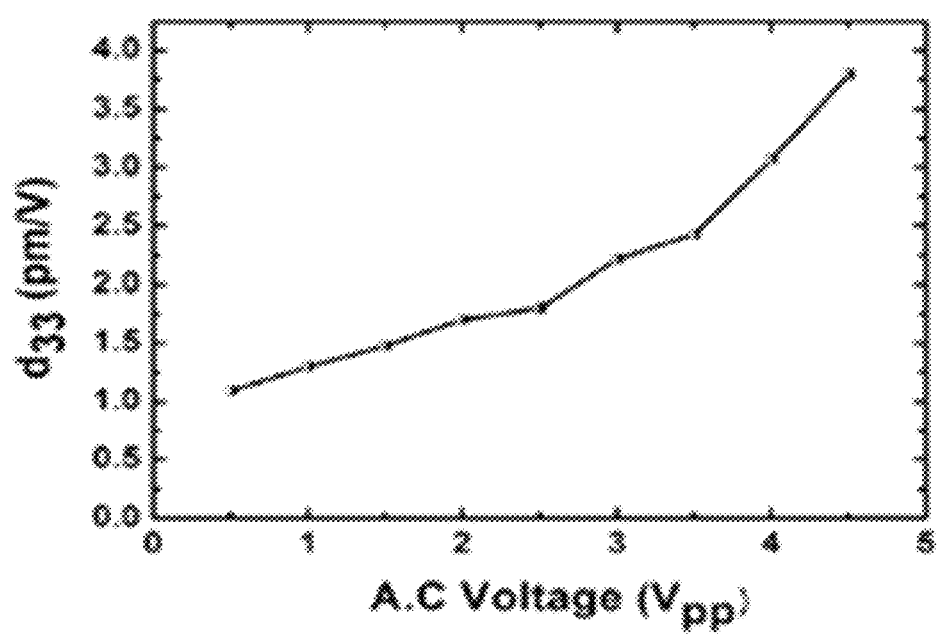

[FIG. 7]
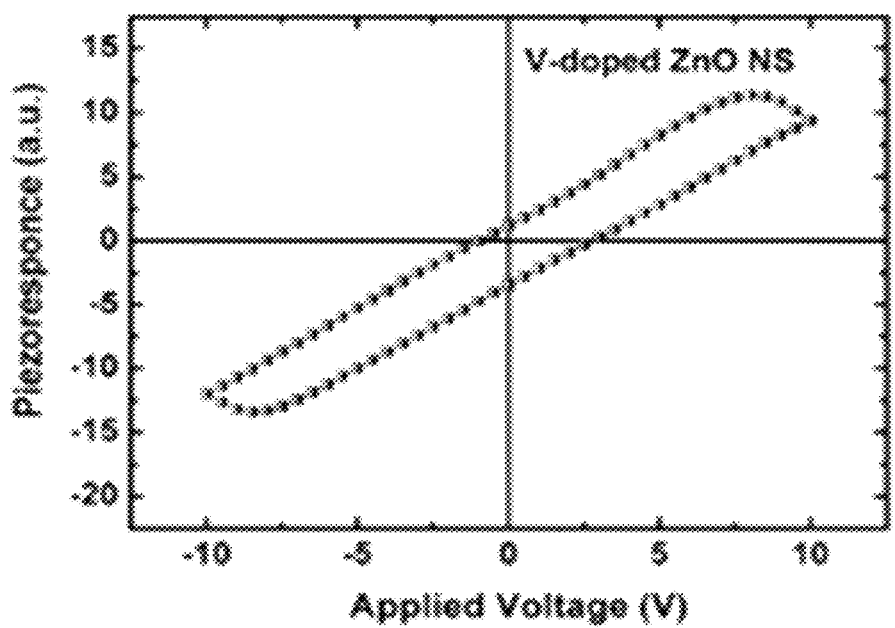

[FIG. 8]
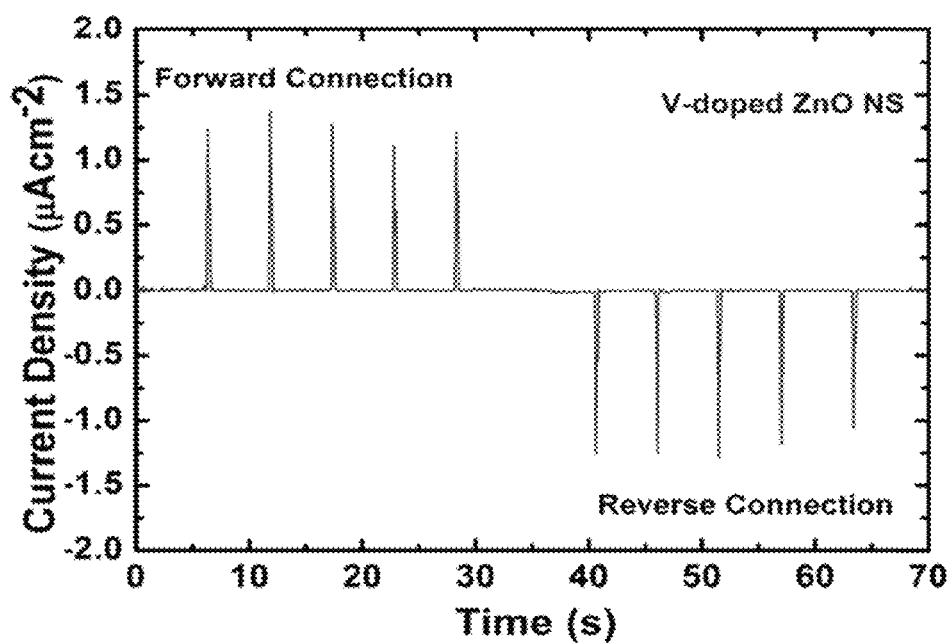

METHOD OF MANUFACTURING ZINC OXIDE NANOSHEET STRUCTURE, AND ELECTRONIC APPARATUS AND TOUCH SENSOR APPARATUS HAVING THE ZINC OXIDE NANOSHEET STRUCTURE

CROSS-REFERENCE TO RELATED APPLICATION

This application claims priority to and the benefit of Korean Patent Application No. 10-2014-0144033, filed on Oct. 23, 2014, and Korean Patent Application No. 10-2015-0028121, filed on Feb. 27, 2015, the disclosure of which is incorporated herein by reference in its entirety.

BACKGROUND

1. Field of the Invention

The present invention relates to a method of manufacturing a zinc oxide nanosheet structure and an electronic apparatus including the zinc oxide nanosheet structure manufactured using the same, in which a two-dimensional zinc oxide nanosheet structure which has piezoelectric properties and ferroelectric properties may be manufactured and may be applied to various electronic apparatuses such as a power generation apparatus, a touch sensor, etc.

2. Discussion of Related Art

Recently, a piezoelectric energy generation device using one-dimensional zinc oxide nanorods on a flexible polymer substrate has been developed. The piezoelectric energy generation device using one-dimensional zinc oxide nanorods is disclosed in Korean Patent Registration No. 10-0851499. The piezoelectric energy generation device using one-dimensional zinc oxide nanorods may be mass-produced but is vulnerable to a mechanical force in such a way that nanorods are damaged when a relatively great mechanical force is applied and has a low power output.

Accordingly, it is necessary to develop a piezoelectric energy generation device which compensates vulnerable mechanical properties of the energy generation device using one-dimensional zinc oxide nanorods and provides a high power output, and research on this has been performed.

SUMMARY OF THE INVENTION

It is an aspect of the present invention to provide a method of manufacturing a zinc oxide nanosheet structure which improves in piezoelectric properties and ferroelectric properties through a simple process.

It is another aspect of the present invention to provide an electronic apparatus which includes the zinc oxide nanosheet structure.

It is still another aspect of the present invention to provide a touch sensor apparatus which includes the zinc oxide nanosheet structure.

According to an aspect of the present invention, there is provided a method of manufacturing a zinc oxide nanosheet structure, including forming a zinc oxide seed on a substrate and forming the zinc oxide nanosheet structure on the substrate by growing zinc oxide from the zinc oxide seed in a zinc oxide growth solution in which first zinc precursors and a doping-element-containing compound are dissolved.

The zinc oxide seed may be formed by applying a seed forming solution in which second zinc precursors are dissolved to the substrate and performing heat treatment thereon. The zinc oxide seed may be formed by performing a plurality of times a process of applying and thermally treating the seed forming solution at a temperature from about 100 to about 200° C.

The doping-element-containing compound may include a metal element which forms metal hydroxide ions negatively charged in the zinc oxide growth solution. For example, the metal element may include one or more selected from the group consisting of vanadium (V), manganese (Mn), cobalt (Co), chrome (Cr), nickel (Ni), iron (Fe), copper (Cu), aluminum (Al), tin (Sn), scandium (Sc), and titanium (Ti). Meanwhile, the metal element may include a transition metal element which has oxygen-coupling strength greater than that of zinc and has a smaller radius than that of zinc ions when ionized. For example, the transition metal element may include one or more selected from the group consisting of V, Mn, Co, Cr, Ni, Fe, Cu, Sc, and Ti.

The first zinc precursors and the second zinc precursors may each independently include one or more compounds selected from the group consisting of zinc chloride ($ZnCl_2$), zinc sulfate ($ZnSO_4$), zinc nitrate ($Zn(NO_3)_2$), zinc acetate ($Zn(CH_3CO_2)_2$), zinc citrate ($Zn_3[O_2CCH_2C(OH)(CO_2)CH_2CO_2]_2$), zinc oxalate ($ZnC_2O_4$), zinc perchlorate ($Zn(ClO_4)_2$), zinc tetrafluoroborate ($Zn(BF_4)_2$), zinc p-toluenesulfonate ($Zn(CH_3C_6H_4SO_3)_2$), zinc trifluoroacetate ($Zn(CF_3COO)_2$) or hydrates thereof.

An amine compound may be further dissolved in the zinc oxide growth solution, and the amine compound may include one or more selected from the group consisting of hexamethyleneamine, hexamethylenetetramine (HMT), cyclohexylamine, monoethanolamine, diethanolamine, and triethanolamine. The zinc oxide may be grown by heating the zinc oxide growth solution at a temperature from about 90 to about 100° C. for from about 2 to about 4 hours.

According to another aspect of the present invention, there is provided an electronic apparatus including a lower electrode, an upper electrode disposed to be spaced apart from the lower electrode, and a zinc oxide nanosheet structure which includes a zinc oxide lattice, a metal element which dopes an inside of the lattice, and hydroxide ions of the doping metal coupled with at least part of outermost zinc ions of the zinc oxide lattice and is disposed between the lower electrode and the upper electrode.

The lower electrode and the upper electrode may each independently include one or more selected from the group consisting of gold (Au), platinum (Pt), palladium (Pd), a Pd—Au alloy (PdAu), Ni, an Ni—Au alloy (NiAu), ruthenium (Ru), silver (Ag), Cu, zinc (Zn), Ti, a Ti—Au alloy (TiAu), Al, indium tin oxide (ITO), fluorine-doped tin oxide (FTO), gallium zinc oxide (GZO), carbon nanotubes (CNT), and graphene.

The electronic apparatus may further include a lower substrate disposed below the lower electrode and an upper substrate disposed above the upper electrode. Herein, the lower electrode is formed on a top surface of the lower substrate and the upper electrode is formed on a bottom surface of the upper substrate. For example, the lower substrate and the upper substrate may each independently include one or more selected from the group consisting of a polymer substrate, a paper substrate, a glass substrate, a sapphire substrate, a silicon substrate, and a ceramic substrate.

The metal element which dopes zinc oxide may include one or more selected from the group consisting of V, Mn, Co, Cr, Ni, Fe, Cu, Al, Sn, Sc, and Ti. Preferably, the metal element may include a transition metal element which has oxygen-coupling strength greater than that of zinc and has a smaller radius than that of zinc ions when ionized such as V, Mn, Co, Cr, Ni, Fe, Cu, Sc, and Ti.

The zinc oxide nanosheet structure may include atoms of the doped metal and zinc atoms of the zinc oxide at a mole ratio from about 1:20 to about 1:30.

The electronic apparatus may be a power generation apparatus. Herein, the electronic apparatus may further include a power storage apparatus electrically connected to the lower electrode and the upper electrode.

According to still another aspect of the present invention, there is provided a touch sensor apparatus including a lower electrode which includes a plurality of first electrode patterns which extend in a first direction and are mutually spaced apart and is disposed above a lower substrate, an upper electrode which includes a plurality of second electrode patterns which extend in a second direction orthogonal to the first direction and are mutually spaced apart and is disposed below an upper substrate which faces the lower substrate, and a plurality of zinc oxide nanosheet structures which are disposed between the lower electrode and the upper electrode, each include a bottom end in contact with one of the first electrode patterns and a top end in contact with all of the second electrode patterns, and are mutually spaced apart.

The zinc oxide nanosheet structures may each include a zinc oxide lattice, a metal element which dopes an inside of the lattice, and hydroxide ions of the doping metal coupled with at least part of outermost zinc ions of the zinc oxide lattice.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which:

FIG. 1 is a flowchart illustrating a method of manufacturing a zinc oxide nanosheet structure according to an embodiment of the present invention;

FIGS. 2A to 2D are perspective views illustrating a method of manufacturing a zinc oxide nanosheet structure according to one embodiment of the present invention;

FIG. 3 is a perspective view of an electronic apparatus according to the embodiment of the present invention;

FIG. 4 is an exploded perspective view of a touch sensor apparatus according to the embodiment of the present invention;

FIG. 5 is photos illustrating relationships between electrode patterns and zinc oxide nanosheet structures shown in FIG. 4;

FIG. 6 is a graph illustrating a piezoelectric coefficient $d_{33}$ of a zinc oxide nanosheet structure doped with vanadium, measured using a piezoelectric force microscopy (PFM);

FIG. 7 is a graph illustrating dielectric properties of the zinc oxide nanosheet structure doped with vanadium; and FIG. 8 is a graph illustrating an output in a state of applying normal stress to a nano power generation device manufactured according to the embodiment of the present invention.

DETAILED DESCRIPTION OF EXEMPLARY EMBODIMENTS

Hereinafter, embodiments will be described in detail with reference to the accompanying drawings. The present invention may, however, be embodied in different forms and should not be construed as limited to the embodiments set forth herein. The following embodiments are provided to allow those skilled in the art to fully understand the scope of the present invention rather than to perfectly complete the present invention.

It will also be understood that when an element is referred to as being disposed on or connected to another element or layer, it can be directly disposed on or connected to the other one, or one or more intervening elements or layers may also be present. Differently, when one element is referred to as being directly disposed on or directly connected to another element, there is no other element therebetween. To describe various elements, components, areas, layers, and/or parts, terms of first, second, third and the like may be used. However, the elements, components, areas, layers, and/or parts are not limited thereto.

Technical terms below are used to describe particular embodiments but not to limit the present invention. Also, unless defined otherwise, all terms including technical and scientific terms have the same meanings that can be understood by a person of ordinary skill in the art. The terms as defined in general dictionaries may be understood to have meanings identical to contextual meanings thereof in descriptions of related art and the present invention. Unless definitely limited, they will not be understood as ideally or excessively external intuition.

The embodiments of the present invention will be described with reference to cross-sectional views schematically illustrating exemplary embodiments of the present invention. According thereto, variations from shapes in the diagrams, for example, variations in manufacturing methods and/or allowable errors may be expected. Accordingly, the embodiments of the present invention will not be described as limited to specific shapes of areas illustrated in the diagrams but will include deviations in the shapes. Also, areas illustrated in the drawings will be substantially schematic and shapes thereof will neither describe definite shapes of the areas nor limit the scope of the present invention.

<Method of Manufacturing Zinc Oxide Nanosheet Structure>

FIG. 1 is a flowchart illustrating a method of manufacturing a zinc oxide nanosheet structure according to an embodiment of the present invention. FIGS. 2A to 2D are perspective views illustrating a method of manufacturing a zinc oxide nanosheet structure according to one embodiment of the present invention. In the embodiment, 'the nanosheet structure' means an integral structure formed by mutually three-dimensionally networking sheets vertically or slantly disposed on a certain supporting surface and having nano-scaled thicknesses.

Referring to FIGS. 1 to 2D, the method of manufacturing the zinc oxide nanosheet structure according to the embodiment of the present invention includes forming a zinc oxide seed on a substrate (S110) and forming a zinc oxide nanosheet structure on the substrate by growing zinc oxide from the zinc oxide seed in a zinc oxide growth solution (S120).

The substrate, if capable of supporting the zinc oxide nanosheet structure, is not particularly limited. For example, as the substrate, a plastic substrate such as polyethylene terephthalate (PET), polyethylene naphthalate (PEN), polyether sulfone (PES), a paper substrate, a glass substrate, a sapphire substrate, a semiconductor substrate such as silicon, or a ceramic substrate such as mica may be used or a conductive substrate formed with a conductive electrode layer on a surface of the listed above may be used.

In the forming of the zinc oxide seed on the substrate (S110), the zinc oxide seed may be formed by applying a seed forming solution in which zinc precursors dissolve onto the substrate and then performing heat treatment thereon.

In one embodiment, as the zinc precursors which dissolve in the seed forming solution, for example, zinc chloride ($ZnCl_2$), zinc sulfate ($ZnSO_4$), zinc nitrate ($Zn(NO_3)_2$), zinc acetate ($Zn(CH_3CO_2)_2$), zinc citrate ($Zn_3[O_2CCH_2C(OH)(CO_2)CH_2CO_2]_2$), zinc oxalate ($ZnC_2O_4$), zinc perchlorate ($Zn(ClO_4)_2$), zinc tetrafluoroborate ($Zn(BF_4)_2$), zinc p-toluenesulfonate ($Zn(CH_3C_6H_4SO_3)_2$), zinc trifluoroacetate ($Zn(CF_3COO)_2$) or hydrates thereof may be used. Meanwhile, the seed forming solution may include zinc precursors of from about 0.01 to about 0.1 M. For example, as the seed forming solution, a zinc acetate dehydrate ($Zn(CH_3COO)_2.2H_2O$) solution of about 0.04 M may be used.

In one embodiment, the zinc oxide seed may be formed by repetitively performing a plurality of times a process of applying the seed forming solution onto the substrate and performing the heat treatment thereon. The seed forming solution may be applied onto the substrate through spin-coating, dip-coating, and spray-coating, and the heat treatment may be performed at a temperature from about 100 to about 200° C., and preferably, may be performed at a temperature from about 140 to about 160° C.

In the forming of the zinc oxide nanosheet structure on the substrate (S120), the substrate on which the zinc oxide seed is formed is dipped into the zinc oxide growth solution and then heated for a certain time, thereby growing zinc oxide from the zinc oxide seed to form the zinc oxide nanosheet structure.

In one embodiment, the zinc oxide growth solution may be manufactured by dissolving zinc precursors, an amine compound, and a doping-element-containing compound in a solvent.

As the zinc precursors which dissolve in the seed forming solution, for example, zinc chloride ($ZnCl_2$), zinc sulfate ($ZnSO_4$), zinc nitrate ($Zn(NO_3)_2$), zinc acetate ($Zn(CH_3CO_2)_2$), zinc citrate ($Zn_3[O_2CCH_2C(OH)(CO_2)CH_2CO_2]_2$), zinc oxalate ($ZnC_2O_4$), zinc perchlorate ($Zn(ClO_4)_2$), zinc tetrafluoroborate ($Zn(BF_4)_2$), zinc p-toluenesulfonate ($Zn(CH_3C_6H_4SO_3)_2$), zinc trifluoroacetate ($Zn(CF_3COO)_2$) or hydrates thereof may be used singularly or two or more in combine.

As the amine compound, hexamethyleneamine, hexamethylenetetramine (HMT), cyclohexylamine, monoethanolamine, diethanolamine, triethanolamine, etc. may be used singularly or two or more in combination.

The doping-element-containing-compound may include a metal element capable of doping zinc oxide. In detail, as the metal element, an element which forms a metal hydroxide ion negatively charged in the zinc oxide growth solution may be used. For example, the metal element may include vanadium (V), manganese (Mn), cobalt (Co), chrome (Cr), nickel (Ni), iron (Fe), copper (Cu), aluminum (Al), tin (Sn), scandium (Sc), titanium (Ti), etc.

Meanwhile, to improve piezoelectric properties and ferroelectric properties of the zinc oxide nanosheet structure, as the metal element, additionally, an element which has coupling strength with oxygen greater than that of zinc and has a radius smaller than that of a zinc ion when ionized may used. For example, the metal element may include a transition metal element such as V, Mn, Co, Cr, Ni, Fe, Cu, Sc, Ti, etc.

When the zinc oxide is grown in the growth solution as described above, a growth of the zinc oxide in a direction vertical to the substrate is reduced and a growth in a direction horizontal to the substrate increases due to metal hydroxide ions formed by dissolution of the doping-element-containing compound. As a result, zinc oxide which is linearly grown in general may be grown in a two-dimensional sheet shape according to the embodiment of the present invention. As an embodiment, as the growth solution, a solution formed by dissolving zinc nitrate hexahydrate [$Zn(NO_3)_2.6H_2O$], hexamethylenetetramine (HMT, $C_6H_{12}N_4$), and vanadium oxide ($V_2O_2$) in a deionized water may be used.

In one embodiment, to form the zinc oxide nanosheet structure, the substrate may be heated at a temperature from about 90 to about 100° C. for from about two to four hours while being dipped in the growth solution.

Meanwhile, in the zinc oxide nanosheet structure manufactured according to the embodiment of the present invention, not only the metal ions may be doped in the zinc oxide but also zinc ions located uppermost may be coupled with metal hydroxide ions. For example, in the zinc oxide nanosheet structure, the metal element may be doped to allow a mole ratio of metal atoms to zinc atoms to be from about 1:20 to about 1:30.

<Electronic Apparatus Including Zinc Oxide Nanosheet Structure>

FIG. 3 is a perspective view of an electronic apparatus 100 according to the embodiment of the present invention.

Referring to FIG. 3, the electronic apparatus 100 according to the embodiment includes a lower electrode 110, an upper electrode 120, and a zinc oxide nanosheet structure 130.

The lower electrode 110 and the upper electrode 120 may be disposed to face each other and may be formed of an electroconductive material.

In one embodiment, the lower electrode 110 and the upper electrode 120 may be formed of gold (Au), platinum (Pt), palladium (Pd), a Pd—Au alloy (PdAu), Ni, an Ni—Au alloy (NiAu), ruthenium (Ru), silver (Ag), Cu, zinc (Zn), Ti, a Ti—Au alloy (TiAu), Al, indium tin oxide (ITO), fluorine-doped tin oxide (FTO), gallium zinc oxide (GZO), carbon nanotubes (CNT), graphene, an electroconductive polymer, etc.

The lower electrode 110 and the upper electrode 120 may be formed of mutually different materials and may be formed of the same material. For example, the lower electrode 110 may be formed of ITO and the upper electrode 120 may be formed of Au.

The lower electrode 110 may be formed on a top surface of a lower substrate 115, and the upper electrode 120 may be formed on a bottom surface of an upper substrate 125.

The lower substrate 115 and the upper substrate 125 may be formed of one of a polymer substrate such as polyimide (PI), PET, PEN, PES, etc., a paper substrate, a glass substrate, a sapphire substrate, a silicon substrate, and a ceramic substrate such as mica.

The lower substrate 115 and the upper substrate 125 may be formed of the same material and may be formed of mutually different materials. For example, the lower substrate 115 may be a PET substrate and the upper substrate 125 may be a PES substrate.

The zinc oxide nanosheet structure 130 is disposed between the lower electrode 110 and the upper electrode 120 and may be in contact with the lower electrode 110 and the upper electrode 120. The zinc oxide nanosheet structure 130 may be formed on the lower electrode 110 or the upper electrode 120 according to the method of manufacturing the zinc oxide nanosheet structure described above with reference to FIGS. 1 to 2D.

The zinc oxide nanosheet structure 130 may be doped with zinc oxide or may be doped with a metal element capable of forming metal hydroxide ions. As one embodiment, the zinc oxide nanosheet structure 130 may be doped with one or more selected from V, Mn, Co, Cr, Ni, Fe, Cu, Al, Sn, Sc, Ti, etc. In an atmosphere in which the metal hydroxide ions are present, when the zinc oxide is grown using a wet-growing method, a plurality of two-dimensional zinc oxide nanosheets may be grown and networked on a substrate, thereby forming a zinc oxide nanosheet structure.

In one embodiment, to improve piezoelectric properties and ferroelectric properties of the zinc oxide nanosheet structure 130, the zinc oxide nanosheet structure 130 may be doped with a transition metal which not only may form metal hydroxide ions but also may have coupling strength with oxygen greater than that of zinc and a radius smaller than that of a zinc ion when ionized. For example, the zinc oxide nanosheet structure 130 may be doped with one or more selected from transition metals such as V, Mn, Co, Cr, Ni, Fe, Cu, Sc, Ti, etc.

When zinc oxide is doped with the transition metal described above, coupling between oxygen and the doped transition metal is stronger than coupling between oxygen and zinc and better rotates due to an external electric field. Accordingly, the zinc oxide doped with the transition metal may have a greater piezoelectric constant than that of undoped zinc oxide. Also, when zinc oxide is doped with the transition metal described above, since ions of the doped transition metal have a smaller radius than that of zinc ions, the doped transition metal ions may be present in a place deviated from a center in a lattice. Accordingly, the zinc oxide doped with the transition metal may have more ferroelectric properties than those of undoped zinc oxide.

Meanwhile, uppermost zinc ions of the zinc oxide nanosheet structure 130 may be coupled with metal hydroxide ions formed by the metal element. As one embodiment, when the zinc oxide nanosheet structure 130 is formed on the lower electrode 110 using the wet-growing method according to the method described with reference to FIG. 1, zinc ions located at an end of the zinc oxide nanosheet structure 130 in contact with the upper electrode 120 may be coupled with the metal hydroxide ions. Since the metal hydroxide ions described above are negatively charged, although external stress is applied to the upper substrate 125 or the lower substrate 115 and then removed, the upper electrode 120 is continuously negatively charged in such a way that electrons stacked on the lower electrode 110 do not move and continuously remain. Accordingly, the electronic apparatus 100 according to the embodiment of the present invention may output a direct current (DC) type output even though external stress is continuously applied.

The electronic apparatus 100 according to the embodiment of the present invention may further include an external circuit 140 electrically connected to the lower electrode 110 and the upper electrode 120. When it is possible to provide an electron transfer path between an upper electrode and a lower electrode, a type or configuration of the external circuit 140 is not particularly limited.

In one embodiment, the electronic apparatus 100 according to the embodiment of the present invention may be a power generation apparatus which generates power using piezoelectric properties of the zinc oxide nanosheet structure 130. In this case, the external circuit 140 may include a power storage apparatus which stores power generated by the zinc oxide nanosheet structure 130 due to external stress. As the power storage apparatus, a well-known energy storage device may be used without limitation.

In another embodiment, the electronic apparatus 100 according to the embodiment of the present invention may be a touch sensor apparatus which senses an external touch applied to the upper substrate 125 or the lower substrate 115 using piezoelectric properties and ferroelectric properties of the zinc oxide nanosheet structure 130. In this case, the external circuit 140 may be a position analysis circuit which senses a position of the external touch applied to the upper substrate 125 or the lower substrate 115.

Hereinafter, referring to FIG. 4, a case in which the electronic apparatus 100 is the touch sensor apparatus will be described.

FIG. 4 is an exploded perspective view of a touch sensor apparatus 100A according to the embodiment of the present invention. FIGS. 5A to 5D are photos illustrating relationships between electrode patterns and zinc oxide nanosheet structures shown in FIG. 4.

Referring to FIGS. 4 to 5D, the touch sensor apparatus 100A according to the embodiment of the present invention may include a lower substrate 115A, a lower electrode 110A, an upper substrate 125A, an upper electrode 120A, and a plurality of zinc oxide nanosheet structures 130A. Meanwhile, although not shown in FIG. 4, the touch sensor apparatus 100A may further include a position analysis circuit electrically connected to the lower electrode 110A and the upper electrode 120A to sense a position of an external touch applied to the upper substrate 125A or the lower substrate 115A.

Since materials of the lower electrode 110A, the lower substrate 115A, the upper electrode 120A, the upper substrate 125A, and the zinc oxide nanosheet structures 130A have been described with respect to the electronic apparatus 100 of FIG. 3, a detailed description thereof will be omitted.

The lower electrode 110A may be disposed above the lower substrate 115A, the upper electrode 120A may be disposed below the upper substrate 125A to face the lower electrode 110A, and the zinc oxide nanosheet structures 130A may be disposed between the lower electrode 110A and the upper electrode 120A.

The lower electrode 110A may include a plurality of first electrode patterns which extend in a first direction and are disposed in parallel. The upper electrode 120A may include a plurality of second electrode patterns which extend in a second direction orthogonal to the first direction and are disposed in parallel.

The first electrode patterns may each include a first length in the first direction and a first width in the second direction. The first electrode patterns may have the same lengths and widths. Also, the first electrode patterns may be spaced apart at certain intervals in the second direction. For example, the first electrode patterns may be spaced apart at first intervals in the second direction. In this case, the first interval means a width of an exposed area of the lower substrate 115A between the adjacent first electrode patterns in the second direction. As one embodiment, widths of the first electrode patterns may be greater than spacing intervals between the first electrode patterns. The second electrode patterns may each include a second length in the second direction and a second width in the first direction. The second electrode patterns may have the same lengths and widths. Also, the second electrode patterns may be spaced apart at second intervals in the first direction. As one embodiment, widths of the second electrode patterns may be greater than spacing intervals between the second electrode patterns. Meanwhile, the first length, the first width, and the first interval of the first electrode patterns may be identical to or different from the second length, the second width, and the second interval of the second electrode patterns.

In one embodiment of the present invention, the zinc oxide nanosheet structures 130A may be disposed on tops of the first electrode patterns, respectively. In this case, the zinc oxide nanosheet structures 130A may have the same lengths and widths as those of the first electrode patterns and may be mutually spaced apart at the same intervals as those of the first electrode patterns. In this case, a bottom end of each of the zinc oxide nanosheet structures 130A may be in contact with one of the first electrode patterns and a top end thereof may be in electrical contact with all of the second electrode patterns.

In another embodiment of the present invention, the zinc oxide nanosheet structures 130A may be disposed on tops of the second electrode patterns, respectively. In this case, the zinc oxide nanosheet structures 130A may have the same lengths and widths as those of the second electrode patterns and may be mutually spaced apart at the same intervals as those of the second electrode patterns. In this case, a top end of each of the zinc oxide nanosheet structures 130A may be in contact with one of the second electrode patterns and a bottom end thereof may be in electrical contact with all of the first electrode patterns.

In a case in which the plurality of zinc oxide nanosheet structures 130A are disposed between the lower electrode 110A and the upper electrode 120A, when an external touch is applied to the lower substrate 115A or the upper substrate 125A, since among the zinc oxide nanosheet structures 130A, only the zinc oxide nanosheet structures 130A to which the external touch is applied generate electricity, among orthogonal coordinates, one coordinate of a position to which the external touch is applied may be quickly and precisely detected. Also, the zinc oxide nanosheet structures 130A which have strong brittleness are disposed to be mutually spaced apart, thereby preventing the zinc oxide nanosheet structures 130A from being damaged by a difference in thermal expansion of the substrate and electrodes or external stress.

Meanwhile, when a plurality of electrode patterns which have widths of about 500 μm and are mutually spaced apart at 100 μm are formed on a substrate and then zinc oxide nanosheet structures are formed according to the embodiment of the present invention as shown in FIG. 5A, it can be known that zinc oxide nanosheet structures are formed only in an area in which the electrode pattern is formed.

EMBODIMENT

A PET substrate coated with an ITO lower electrode was prepared. Subsequently, a process in which the ITO lower electrode was spin-coated with a zinc acetate dehydrate [$Zn(CH_3COO)_2 \cdot 2H_2O$] solution at a concentration of about 0.04 M and was thermally treated at a temperature of about 150° C. was performed six times, thereby forming a zinc oxide seed on the ITO lower electrode.

After that, a growth solution was prepared by dissolving zinc nitrate hexahydrate [$Zn(NO_3)_2 \cdot 6H_2O$] and HMT ($C_6H_{12}N_4$) of about 0.025 M and vanadium oxide ($V_2O_2$) of about 0.001 M in deionized water and the PET substrate formed with the zinc oxide seed was dipped in the growth solution and heated at a temperature of about 95° C. for three hours, thereby forming a zinc oxide nanosheet structure doped with V on the ITO lower electrode.

Sequentially, a PES film on which an Au upper electrode had been deposited was prepared and then was attached to the nanosheet structure to allow the Au upper electrode to be in contact with the nanosheet structure, thereby manufacturing a power generation apparatus.

EXPERIMENTAL EXAMPLE

FIG. 6 is a graph illustrating a piezoelectric coefficient $d_{33}$ of a zinc oxide nanosheet structure doped with V, measured using a piezoelectric force microscopy (PFM).

Referring to FIG. 6, it could be known that the piezoelectric coefficient $d_{33}$ of the zinc oxide nanosheet structure doped with V, measured using the PFM, is about 4 pm/V, which is relatively high. Since coupling of V—O generated by doping with V is stronger than coupling of Zn—O and more easily rotates due to an external electric field, it is determined that the zinc oxide nanosheet structure doped with V has a higher piezoelectric coefficient than that of a zinc oxide nanosheet structure not doped with V. Accordingly, when the zinc oxide nanosheet structure doped with V is used as a piezoelectric body, it is possible to produce a current having higher density than when the zinc oxide nanosheet structure not doped with V is used.

FIG. 7 is a graph illustrating dielectric properties of the zinc oxide nanosheet structure doped with V.

Referring to FIG. 7, it is possible to know that the zinc oxide nanosheet structure doped with V has ferroelectric properties. This is because, due to smaller radiuses than those of zinc ions, V ions formed by V doping can exist in a position deviated from a center of a lattice. That is, the zinc oxide nanosheet structure doped with V shows higher ferroelectric properties than those of a zinc oxide nanosheet structure not doped with V.

Accordingly, in a case in which the zinc oxide nanosheet structure doped with V is used as a piezoelectric body, even when stress applied to the power generation apparatus is removed, since an upper electrode and a lower electrode are charged as in a stress-applied state, a power generation apparatus may produce a DC type output current.

FIG. 8 is a graph illustrating an output in a state of applying normal stress to a power generation apparatus manufactured according to the embodiment of the present invention. In FIG. 8, a positive current value is a value measured by forward connecting a current measurement device to the power generation apparatus and a negative current value is a value measured by reversely connecting the current measurement device to the power generation apparatus.

Referring to FIG. 8, it can be known that the power generation apparatus shows a DC type output current when normal stress is continuously applied. This is because, as described above, not only the zinc oxide nanosheet structure doped with V has ferroelectric properties but also even when external stress is applied to an upper substrate or an lower substrate and then removed by vanadium hydroxide ions $V(OH)_4-$ coupled with a top end of the zinc oxide nanosheet structure doped with V, an upper electrode is continuously negatively charged in such a way that electrons stacked on a lower electrode do not move and continuously remain.

Meanwhile, considering an output current value changes from a positive value to a negative value according to a change in a connection direction of the current measurement device from a forward direction to a reverse direction, it may be known that the measured current value is a current generated by the power generation apparatus, not the current measurement device.

According the embodiments of the present invention described above, zinc oxide is grown in a zinc oxide growth solution which contains metal hydroxide ions negatively charged, thereby reducing vertical growth of the zinc oxide but boosting horizontal growth thereof. As a result, zinc oxide which is generally grown in one dimension may be stably grown in a two-dimensional sheet shape.

Also, an inside of a zinc oxide lattice is doped with transition metal ions which have oxygen-coupling strength greater than that of zinc and radiuses smaller than those of zinc ions, thereby improving a piezoelectric constant and ferroelectric properties of a manufactured zinc oxide nanosheet structure.

Meanwhile, an electronic apparatus which includes the zinc oxide nanosheet structure manufactured as described above may provide a DC type output even when external stress is continuously applied due to the transition metal element which dopes the inside of the lattice and transition metal hydroxide ions coupled with a top thereof.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An electronic apparatus comprising:
   a lower electrode;
   an upper electrode disposed to be spaced apart from the lower electrode; and
   a zinc oxide nanosheet structure which comprises a zinc oxide lattice, a metal element which dopes an inside of the lattice, and hydroxide ions of the doping metal coupled with at least part of outermost zinc ions of the zinc oxide lattice and is disposed between the lower electrode and the upper electrode.

2. The electronic apparatus of claim 1, wherein the lower electrode and the upper electrode each independently comprise one or more selected from the group consisting of gold (Au), platinum (Pt), palladium (Pd), a Pd—Au alloy (PdAu), Ni, an Ni—Au alloy (NiAu), ruthenium (Ru), silver (Ag), Cu, zinc (Zn), Ti, a Ti—Au alloy (TiAu), Al, indium tin oxide (ITO), fluorine-doped tin oxide (FTO), gallium zinc oxide (GZO), carbon nanotubes (CNT), and graphene.

3. The electronic apparatus of claim 1, further comprising:
   a lower substrate disposed below the lower electrode; and
   an upper substrate disposed above the upper electrode,
   wherein the lower electrode is formed on a top surface of the lower substrate and the upper electrode is formed on a bottom surface of the upper substrate.

4. The electronic apparatus of claim 3, wherein the lower substrate and the upper substrate each independently comprise one or more selected from the group consisting of a polymer substrate, a paper substrate, a glass substrate, a sapphire substrate, a silicon substrate, and a ceramic substrate.

5. The electronic apparatus of claim 1, wherein the metal element comprises one or more selected from the group consisting of V, Mn, Co, Cr, Ni, Fe, Cu, Al, Sn, Sc, and Ti.

6. The electronic apparatus of claim 1, wherein the metal element comprises a transition metal element which has oxygen-coupling strength greater than that of zinc and has a smaller radius than that of zinc ions when ionized.

7. The electronic apparatus of claim 6, wherein the transition metal element comprises one or more selected from the group consisting of V, Mn, Co, Cr, Ni, Fe, Cu, Sc, and Ti.

8. The electronic apparatus of claim 1, wherein the zinc oxide nanosheet structure comprises atoms of the metal and zinc atoms at a mole ratio from about 1:20 to about 1:30.

9. The electronic apparatus of claim 1, wherein the electronic apparatus is a power generation apparatus, and
   wherein the electronic apparatus further comprises a power storage apparatus electrically connected to the lower electrode and the upper electrode.

10. A touch sensor apparatus comprising:
    a lower electrode which comprises a plurality of first electrode patterns which extend in a first direction and are mutually spaced apart and is disposed above a lower substrate;
    an upper electrode which comprises a plurality of second electrode patterns which extend in a second direction orthogonal to the first direction and are mutually spaced apart and is disposed below an upper substrate which faces the lower substrate; and
    a plurality of zinc oxide nanosheet structures which are disposed between the lower electrode and the upper electrode, each comprise a bottom end in contact with one of the first electrode patterns and a top end in contact with all of the second electrode patterns, and are mutually spaced apart.

11. The touch sensor apparatus of claim 10, wherein the zinc oxide nanosheet structures each comprise a zinc oxide lattice, a metal element which dopes an inside of the lattice, and hydroxide ions of the doping metal coupled with at least part of outermost zinc ions of the zinc oxide lattice.

* * * * *